United States Patent [19]

Blum et al.

[11] Patent Number: 5,243,289
[45] Date of Patent: Sep. 7, 1993

[54] MULTIPLY-TUNED PROBE FOR MAGNETIC RESONANCE IMAGING OR SPECTROSCOPY

[75] Inventors: Haywood Blum, Philadelphia; Matthew D. Mitchell, Glenside, both of Pa.

[73] Assignee: The Trustees of the University of Pennsylvania, Philadelphia, Pa.

[21] Appl. No.: 743,785

[22] Filed: Aug. 9, 1991

[51] Int. Cl.$^5$ ............................................. G01R 33/20
[52] U.S. Cl. ................................................... 324/322
[58] Field of Search ............... 324/300, 307, 309, 310, 324/311, 312, 313, 314, 318, 322; 335/219; 128/653.5

[56] References Cited

U.S. PATENT DOCUMENTS 4,742,304  5/1988  Schnall et al. .................. 324/318
4,792,759 12/1988  Keren et al. ..................... 324/322

OTHER PUBLICATIONS

Decorps et al., entitled "An Inductively Coupled, Series-Tuned NMR Probe", *Journal of Magnetic Resonance*, vol. 65, pp. 100-109 (1985).

Eleff et al., "Concurrent Measurements of Cerebral Bloodflow, Sodium, Lactate, and High-Energy Phosphate Metabolism Using $^{19}F, ^{23}Na, ^{1}H$ and $^{31}P$ Nuclear Magnetic Resonance Spectroscopy", *Magnetic Resonance in Medicine*, vol. 7, pp. 412-424 (1988).

Fitzsimmons et al., "A Comparison of Double-Tuned Surface Coils", *Magnetic Resonance in Medicine*, vol. 10, pp. 302-309 (1989).

Fitzsimmons et al., "A Transformer-Coupled Double-Resonant Probe For NMR Imaging and Spectroscopy", *Magnetic Resonance in Medicine*, vol. 5, pp. 471-477 (1987).

Schnall et al., "A New Double-Tuned Probe For Concurrent $^1H$ and $^{31}P$ NMR", *Journal of Magnetic Resonance*, vol. 65, pp. 122-129 (1985).

Schnall, *NMR Techniques In The Study of Cardiovascular Structure and Function*, N. Osbakken and J. Haselgrove, Eds., (Futura Publishing, Mt. Kisco, N.Y.), 1988, Chapter 2, pp. 35-37.

Schnall et al., "The Application of Overcoupled Tank Circuits to NMR Probe Design", *Journal of Magnetic Resonance*, vol. 67, pp. 129-134 (1986).

Wang et al., "In Vivo MRS Measurement of Deoxymyoglobin in Human Forearms", *Magnetic Resonance in Medicine*, vol. 14, pp. 562-567 (1990).

*Primary Examiner*—Michael J. Tokar
*Attorney, Agent, or Firm*—Woodcock Washburn Kurtz Mackiewicz & Norris

[57] ABSTRACT

A multiply-tuned probe for magnetic resonance imaging or spectroscopy in which a driving inductor is separately coupled to two or more trap inductors. The impedance match at each frequency is adjusted independently of the impedance match at the other frequencies and independent of the tuning by using a novel coil geometry with no overcoupling. In a preferred embodiment, a triple-tuned probe has a first inductor $L_1$ disposed in a first plane and tuned to a first resonant frequency and a second inductor $L_2$ disposed in a second plane parallel to the first plane and tuned to a second resonant frequency. A driving and receiving primary inductor $L_p$ is disposed in a third plane parallel to the first and second planes and placed with respect to the first and second inductors $L_1$ and $L_2$ such that mutual inductance between $L_1$ and $L_p$ in between $L_2$ and $L_p$ is adjustable in accordance with the positions of the inductors $L_1$, $L_2$ and $L_p$. A sample surface inductor $L_s$ tuned to a third resonant frequency provides the third frequency. Mutual inductance between $L_1$ and $L_p$ in between $L_2$ and $L_p$ is changed by repositioning the inductors $L_1$, $L_2$ and $L_p$ to vary the amount of overlap between the cross-sections of the primary inductor $L_p$ and the circular coils $L_1$, $L_2$ and the distances between inductors $L_1$ and $L_p$ and between inductors $L_2$ and $L_p$. Since each inductive coupling adds another variable to the probe circuit, more and easier ways are provided for adjusting the tuning and impedance matching.

10 Claims, 4 Drawing Sheets

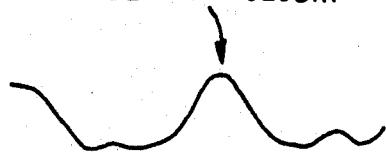
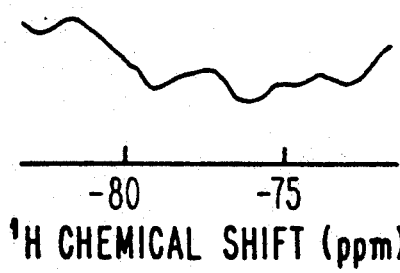
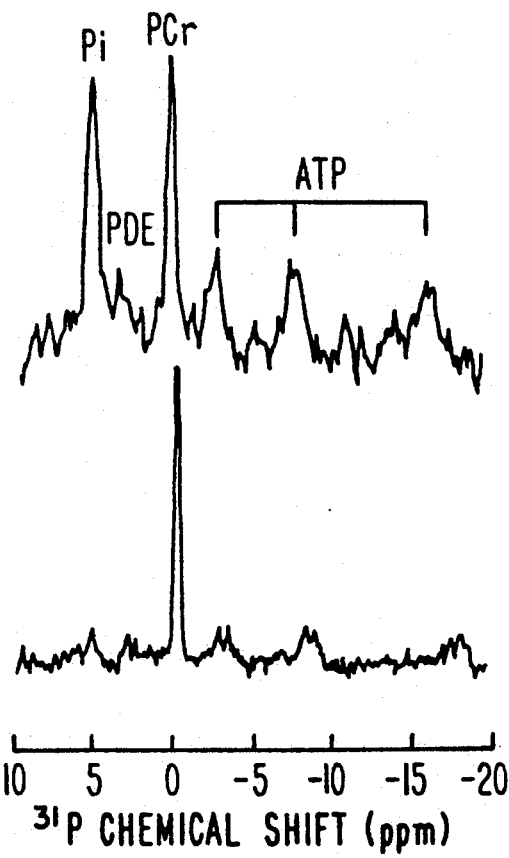
Fig. 9a
Fig. 9b

MULTIPLY-TUNED PROBE FOR MAGNETIC RESONANCE IMAGING OR SPECTROSCOPY

BACKGROUND OF THE INVENTION

1. Field of the Invention

The present invention relates to a multiply-tuned probe for magnetic resonance imaging or spectroscopy, and more particularly, to a probe in which the driving inductor is coupled to two or more trap inductors which can be independently adjusted to separate resonant frequencies.

2. Description of the Prior Art

In multinuclear nuclear magnetic resonance (NMR) spectroscopy, a sample coil and associated tuning circuit (together commonly called the probe) must be resonant at the Larmor frequency of each nucleus under observation. Multi-nuclear NMR allows separate physiological experiments to be done simultaneously on a single sample, thereby ensuring good correlation between disparate measurements. However, the ability to concurrently acquire NMR signals from multiple nuclei depends upon having a probe which can be multiply-tuned to the respective frequencies for each nuclei. The sensitivity at each frequency must be good enough to allow adequate signal to noise levels, and ideally, the signal to noise ratio should be comparable at each frequency with a probe singly-tuned to that frequency. Optimum signal to noise ratios of each nucleus have typically been achieved by matching the impedance of the probe at each resonant frequency to the nominal impedance of the spectrometer. Furthermore, the impedance at all resonant frequencies of a multiply-tuned probe must be simultaneously matched to the impedance of the rest of the transmit/receive circuitry for the most efficient transmission of power. However, impedance matching for all nuclei has not been satisfactorily achieved in a repeatable manner.

Despite the above-mentioned problems with impedance matching, the use of multiply-tuned probes for in vivo multinuclear NMR studies is now commonplace. However, while multiply-tuned probes can be quite efficient when compared to singly-tuned probes, it remains difficult to match to the impedance of the spectrometer at multiple frequencies. For example, when probes are multiply-tuned without overcoupling, a large interaction among the respective coils makes it difficult to tune and impedance match the probe to the transmit/receive circuitry. As a result, the coils of prior art multiply-tuned probes have had to be tuned separately to the desired resonant frequencies and then tuned together so as to compensate for the effect each coil has on each other coil. It is desirable for each frequency to be as independently tunable as possible so as to make simultaneous optimization of all coil parameters possible.

FIG. 1 illustrates a conventional single-tuned surface coil probe having a sample inductor $L_s$ which is transformer coupled to a primary coil $L_p$. The sample inductor $L_s$ and variable capacitance $C_s$ form an LC circuit which may be tuned to a desired resonant frequency by varying the capacitance of variable capacitor $C_s$. A multiply-tuned probe is considerably more sophisticated than the probe of FIG. 1 in that a multiply-tuned probe may be tuned to two or more desired resonant frequencies concurrently such that separate physiological experiments may be done simultaneously on a single sample. However, at present, because of the difficulty in matching the probe to the impedance of the spectrometer at multiple frequencies, prior art multiply-tuned probes generally have been limited to double-tuned probes or surface coils for obtaining proton images and localized spectra of other nuclei from the same region of interest where the signal to noise ratio is optimized for only one frequency.

Over the past several years, a wide variety of such double-tuned surface coils have been disclosed. Ideally, such double-tuned surface coils provide high signal to noise ratios at each resonant frequency of interest, provide high homogeneity of the RF field $B_1$ and allow operation on multiple frequencies without retuning or cable changes. However, in practice, prior art double-tuned surface coils have traded off between an acceptable level of $B_1$ homogeneity and an acceptable signal to noise ratio.

Double-tuned surface coils of the prior art have been grouped according to the mechanism by which they achieve double resonance by Fitzsimmons et al. in an article entitled "A Comparison of Double-Tuned Surface Coils", *Magnetic Resonance in Medicine*, Vol. 10, pp. 302–309 (1989). Fitzsimmons et al. therein compare the operation of existing double-tuned surface coil designs and note that the oldest approach for achieving double resonance is to use quarter wave transmission lines to tune and match. Such designs incur a loss which is due to the fact that a quarter wave line always has a finite impedance even when one end is open circuited. The "short circuit" loss appears in series with a tuned circuit and produces a loss in circuit Q. Fitzsimmons et al. also recognize that the variable length lines have been used to place tuning components outside of the sample environment so as to cause circulating currents from the tank circuit to pass through the transmission line, resulting in reduced efficiency. Since the transmission line is not being utilized at its characteristic impedance, the resulting losses are a function of the line equivalent resistance in series with the resistance of the tuned circuit. Because high Q circuits have very low series resistance, the resistance added by the transmission lines significantly degrades the Q. For these reasons, prior art arrangements typically match the impedance of the tuned circuit to the impedance of the transmission line in an attempt to improve efficiency.

In order to reduce the losses inherent in transmission line schemes, others have proposed designs which use LC networks and simulated quarter wave lines. These approaches result in currents circulating in inductors (traps) which are not coupled to the sample. Hyde et al. introduced a double-tuned version of the loop gap resonator wherein the coil utilizes a pair of loop gap resonators stacked one on top of the other. However, performance of this design has been limited by filling factor considerations. A transformer-coupled double-tuned coil where two coil elements are wound concentrically in the same plane with a very high multiple inductance between them has also been disclosed to keep both of the coil elements in close proximity to the sample so as to minimize the filling factor. However, opposing currents in the high-frequency mode introduced losses into such a design. Fitzsimmons et al. thus concluded that no prior art double-tuned surface coil design has been completely free of circuit losses.

Such prior art double-tuned surface coil designs will now be discussed with reference to prior art FIGS. 2–5.

The afore-mentioned double-tuned loop gap resonator probe disclosed by Hyde et al. is shown in prior art FIG. 2. In FIG. 2, inductors $L_1$ and $L_2$ are typically positioned vertically on a cylindrical form. Capacitances $C_1$ and $C_2$ tune the inductors to the high frequency mode, while capacitance $C_3$ tunes the inductors $L_1$ and $L_2$ to the low frequency mode. In this design, double resonance is achieved from the two loosely coupled LC circuits. In the high-frequency mode, the two coils constitute a counter-rotating current pair. Connections may be made between the two coils to permit them to operate in series resonance for the low-frequency mode. The high-frequency mode efficiency is limited by the magnitude of the counter-rotating current in the second loop while the low-frequency efficiency is limited by the reduction in filling factor due to the fact that the second loop is physically distant from the sample. This design was shown by Fitzsimmons et al. to be relatively efficient in the high-frequency mode but relatively inefficient in the low-frequency mode.

FIG. 3 illustrates a transformer-coupled doubletuned coil of the type disclosed by Fitzsimmons et al. in an article entitled "A Transformer-Coupled Double-Resonant Probe For NMR Imaging and Spectroscopy", *Magnetic Resonance in Medicine*, Vol. 5, pp. 471–477 (1987). As described by Fitzsimmons et al. and shown in FIG. 3, a transformer-coupled double-tuned coil is an example of an "overcoupled" primary and secondary circuit where two coils $L_1$ and $L_2$ are tightly wound in a coaxial fashion to achieve a high mutual inductance or coupling. Such a high degree of coupling produces two resonances where the frequency difference is determined by the magnitude of the mutual coupling and the values of the primary and secondary capacitances $C_1$ and $C_2$. As shown in FIG. 3, there need be no direct electrical connection between the primary and the secondary circuit. $L_2$ and $C_2$ form a high-frequency circuit, while $L_1$ and $C_1$ are primarily responsible for the low-frequency mode. The high-frequency efficiency of this circuit is limited by the large counter-rotating current in the primary loop through inductor $L_1$; however, the low-frequency mode will have current flow in the same direction in both loops and will provide a good filling factor. An additional capacitor between the coils $L_1$ and $L_2$ enables the frequencies of both circuits to be matched to the transmission line impedance.

FIG. 4 illustrates a double-tuned trap circuit of the type disclosed by Schnall et al. in an article entitled "A New Double-Tuned Probe For Concurrent $^1$H and $^{31}$P NMR", *Journal of Magnetic Resonance*, Vol. 65, pp. 122-129 (1985). In the double-tuned trap circuit of FIG. 4, the inductor $L_{sample}$ is the inductor in contact with the sample while the inductor $L_{trap}$ is positioned on the circuit board along with the other components. Inductor $L_{trap}$ and capacitance $C_{trap}$ make up the "trap" circuit which permits tuning the network to the high-frequency mode while the combination of the trap circuit and capacitance $C_m$ allows tuning to the low-frequency mode. Such a design is based on the use of additional inductive and capacitive components placed outside of the main inductor that is coupled to the sample. In other words, as shown in FIG. 4, the trap design incorporates a parallel resonant circuit within a parallel resonant circuit which represents, in the high-frequency mode, an impedance which is predominantly capacitive in phase appearing in series with a large capacitor $C_2$. High-frequency losses are minimized by maximizing the trap inductance, which essentially causes the two capacitors $C_{trap}$ and $C_2$ to be connected in series. In the low-frequency mode, on the other hand, the trap is predominantly inductive in phase. In this mode, losses are minimized by minimizing the trap inductance since this inductance appears in series with the sample inductor. In practice, a small trap inductance is used since it is typically more important to maximize performance in the low-frequency mode.

The transformer-coupled double-tuned coil of FIG. 3 and the double-tuned trap circuit of FIG. 4 have been shown by Fitzsimmons et al. to be very efficient in the low-frequency mode but relatively inefficient in the high-frequency mode. This inefficiency is believed to be in part due to the inability of the coils to be independently adjusted to match the impedance of the transmit/receive circuitry and to be easily tuned without having to separately tune for the effects the coils have on each other. An improved probe design is desired.

FIG. 5 illustrates an improved surface coil design in which the sample coil $L_{sample}$ is driven by the spectrometer and the inductors $L_1$ and $L_2$ are configured perpendicular to each other so that they will not couple to each other, thereby minimizing losses. In this configuration, the impedance of the entire probe can be varied by moving $L_d$ with respect to $L_{sample}$ and changing the coupling between them. However, the impedance matching at each frequency of such a surface coil design cannot be separately adjusted.

Accordingly, a multiply-tuned probe is desired which may be simultaneously matched to the impedance of the rest of the transmit/receive circuitry at a plurality of resonant frequencies without the aforementioned impedance matching and tuning difficulties. Moreover, it is desired to provide a probe which may be tuned to three or more resonant frequencies while still allowing for easy tuning and high efficiency. The multiply-tuned probe of the invention has been designed to meet these needs.

SUMMARY OF THE INVENTION

The multiply-tuned probe of the invention provides the above-mentioned benefits by modifying the inductively driven series tank circuit described by Schnall et al. such that the driving inductor which is connected to the transmit/receive circuitry may be coupled to two or more trap inductors. The match at the resonant frequency for the respective trap inductors of the probe of the invention can then be adjusted somewhat independently of the match of the other frequencies and independently of the tuning. The resulting probe has many desirable characteristics, including high efficiency and easy tuning without overcoupling. Moreover, the present invention is believed to represent a tremendous breakthrough in the NMR probe art in that the probe of the invention is simple yet provides for good sensitivity at three or more nuclear frequencies for simultaneous measurement.

A preferred embodiment of such a multiply-tuned probe in accordance with the invention is designed for use in magnetic resonance imaging or spectroscopy and preferably comprises a first inductor L1 disposed in a first plane and tuned to a first resonant frequency, a second inductor L2 disposed in a second plane, parallel to the first plane, and tuned to a second resonant frequency, and a driving and receiving primary inductor Lp disposed in a third plane which is parallel to the first and second planes. In accordance with the invention, the primary inductor Lp is preferably disposed with respect to the first and second inductors L1 and L2 such that mutual inductance between L1 and Lp and between L2 and Lp is adjustable in accordance with the positions of the inductors L1, L2 and Lp. Preferably, the probe of the invention further comprises a sample surface inductor Ls tuned to a third resonant frequency by a series capacitor $C_s$.

In preferred geometric configurations of the invention, the first inductor L1 and second inductor L2 are coaxially disposed circular coils, while the primary inductor Lp comprises a primary circular coil disposed between the first inductor L1 and second inductor L2 such that at least a portion of a cross-section of the primary circular coil overlaps a cross-section of the coaxially disposed circular coils in a direction parallel to the coaxially disposed circular coils. The primary circular coil may also be coaxial with the coaxially disposed circular coils. Such an arrangement allows the mutual inductance between L1 and Lp and between L2 and Lp to be changed in accordance with the amount of overlap between the cross-sections of the primary circular coil and the coaxially disposed circular coils and the distances between inductors L1 and Lp and between inductors L2 and Lp. Since each coupling adds another variable to the probe circuit of the invention, the arrangement of the invention provides more ways to adjust the tuning and matching, thereby enabling impedance matching to be adjusted separately at multiple frequencies.

In a preferred embodiment of the invention, the first inductor L1 is part of a first tank circuit which further comprises a first variable capacitance C1 for tuning the first tank circuit to the first resonant frequency, while the second inductor L2 is part of a second tank circuit which further comprises a second variable capacitance C2 for tuning the second tank circuit to the second resonant frequency. A sample variable capacitance Cs may also be provided in series with the sample surface inductor Ls and the first and second tank circuits. Preferably, the sample variable capacitance Cs is adjustable so as to tune the sample surface inductor Ls to the third resonant frequency In addition, the first inductor L1, the second inductor L2 and the sample surface inductor Ls may be respectively impedance matched to the transmission line to the spectrometer at the first, second and third resonant frequencies simultaneously.

In accordance with another aspect of the invention, the multiply-tuned probe of the invention may comprise at least two concentrically disposed trap circuits, where each trap circuit is tuned to a desired resonant frequency, and a driving and receiving primary inductor Lp substantially concentrically disposed with respect to the trap circuits such that mutual inductance between Lp and each of the trap circuits is adjustable in accordance with the relative positions of Lp and each of the trap circuits. Additional trap circuits thus may be added to the probe of the invention without significantly compromising sensitivity so that a plurality of nuclei may be investigated concurrently with good results at all frequencies.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which:

FIG. 9(A) illustrates a $^1H$ spectra of the human calf taken at rest and during strenuous isometric flexion exercise using the triple-tuned probe of FIG. 6.

FIG. 9(B) illustrates a $^{31}P$ spectra of the human calf taken at rest and during strenuous isometric flexion exercise using the triple-tuned probe of FIG. 6.

DETAILED DESCRIPTION OF THE PRESENTLY PREFERRED EXEMPLARY EMBODIMENT

The inventors of the subject matter disclosed and claimed herein have met the above-mentioned needs in the art by developing a multiply-tuned probe or surface coil for in vivo experiments which has good sensitivity at a plurality of nuclear frequencies. Such a multiply-tuned probe of the invention will be particularly described below with respect to FIGS. 6 and 7 and results for in vivo NMR studies of $^{31}P$, $^2H$ and $^1H$ will be illustrated in FIGS. 8 and 9. Although the invention will be described for use in in vivo NMR studies of $^{31}P$, $^2H$ and $^1H$, it will be appreciated by those of ordinary skill in the art that the description herein is for exemplary purposes only and is not intended in any way to limit the scope of the invention. In other words, the multiply-tuned probe of the invention also may be used to detect numerous other nuclei for completely different purposes. Those skilled in the art will appreciate that the surface coil of the invention may be tuned to more than three nuclear frequencies and that three are shown merely for sake of ease of description. Accordingly, all questions regarding the scope of the invention may be resolved by referring to the appended claims.

Figure 6:
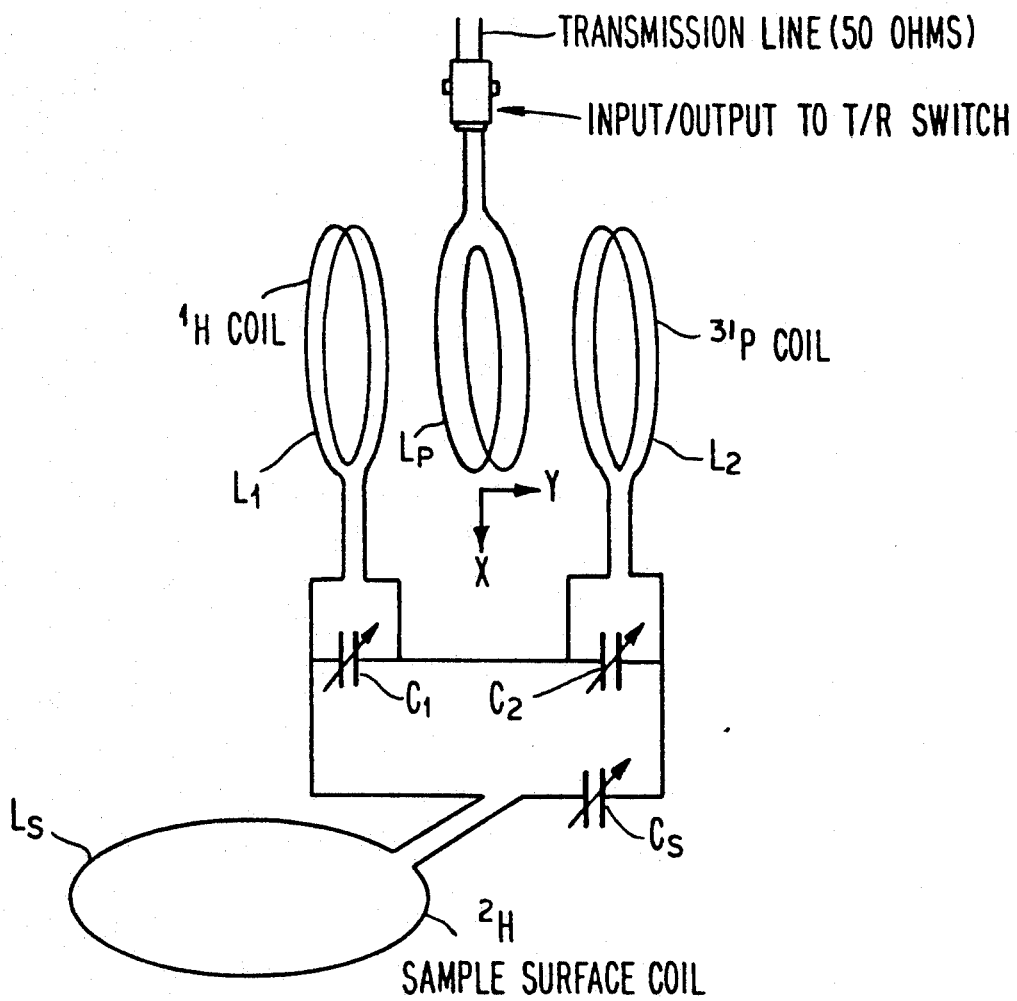
FIG. 6 illustrates a triple-tuned probe configuration utilizing the teachings of the invention.

FIG. 6 illustrates a simple triple-tuned surface coil for in vivo experiments which has a good sensitivity at three nuclear frequencies. As will be described below, the configuration of FIG. 6 has been used for in vivo NMR studies of $^{31}P$, $^2H$ and $^1H$, and, as a result of those tests, the present inventors have unexpectedly discovered that the probe illustrated in FIG. 6 has its highest sensitivity at the highest frequency As noted by Fitzsimmons et al., such a result is difficult to achieve in that typical multiply-tuned probes are generally more sensitive at lower frequencies.

Figure 7:
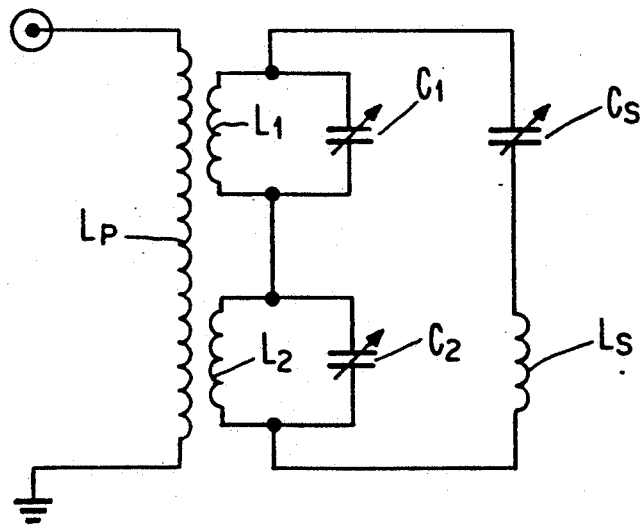
FIG. 7 is an equivalent schematic diagram of the triple-tuned probe of FIG. 6.

The configuration of the components of the triple-tuned probe of the invention is illustrated in FIG. 6. As shown, a first trap circuit having a first inductor $L_1$ and a first variable capacitor $C_1$ is tuned to a first resonant frequency for $^1H$. A second trap circuit having a second inductor $L_2$ and a second variable capacitor $C_2$ is also provided which is tuned to a second resonant frequency, preferably that for $^{31}P$. In addition, a sample surface coil $L_s$ and a variable capacitor $C_s$ are also provided for tuning to a third resonant frequency, preferably that of $^2H$. To satisfy the resonance condition, the reactance of the sample inductor $L_s$ is preferably the inverse of the tuning circuit comprised of $C_s$ and the parallel tank circuits $L_1C_1$ and $L_2C_2$. The parallel tank circuits add poles to the reactance of the tuning circuit, and by varying $C_1$ and $C_2$, the pole frequencies can be varied almost completely independently of each other and of the third resonance. Finally, a driving and receiving primary inductor $L_p$ is provided for driving the probe with pulses received from the spectrometer over a transmission line in accordance with techniques known to those skilled in the art. FIG. 7 illustrates a corresponding schematic diagram of the probe circuit of FIG. 6.

For the probe illustrated in FIG. 6, the relative positions of each of the coils is quite important in the implementation of the invention. Preferably, the sample surface inductor $L_s$ comprises a coil having an 8 cm diameter single turn of 3 mm outside diameter copper tubing, while the diameters of coils $L_1$ and $L_2$ are 1.5 cm and 3.0 cm, respectively. Coils $L_1$ and $L_2$ are each preferably made of two turns of tinned 14 AWG copper wire and mounted coaxially on either side of the two-turn, 2.5 cm diameter, driving and receiving primary inductor $L_p$. As shown, each coil $L_1$ and $L_2$ with its corresponding capacitor, $C_1$ and $C_2$, forms a tank circuit which is tuned to one of the chosen nuclear frequencies. The sample inductor is tuned to the third frequency with the series capacitor $C_s$. In a preferred embodiment, the probe of FIG. 6 is tuned for proton, phosphorous and deuterium MR spectroscopy at all three resonant frequencies of the corresponding nuclei (78.1 MHz, 31.6 MHz and 12.0 MHz, respectively) by varying the capacitances $C_1$, $C_2$ and $C_s$ in an iterative process. Preferably, the highest frequency is tuned first, then the middle, then the lowest frequency.

The illustrated configuration of the probe of FIG. 6 is important in the amount of coupling thereby provided between the respective coils. In particular, the illustrated configuration allows the mutual inductance between $L_p$ and $L_1$ and between $L_p$ and $L_2$ to be adjusted by changing the relative positions of the coils. In other words, because of its configuration the probe illustrated in FIG. 6 is driven through two or more inductors rather than one and is sensitive to the NMR sample at each resonant frequency of the respective coils. Cross-sectional overlap of the coils in the X direction and relative distances between the coil $L_p$ and coils $L_1$ and $L_2$ in the Y direction are preferably separately adjusted for changing the coupling between the respective coils and hence the mutual inductance. Since each coupling adds another variable to the probe circuit, the invention provides more ways to adjust the tuning and matching. For example, coupling between three inductors may be separately adjusted by moving either coils $L_1$ or $L_2$ closer or farther away from the driving and receiving primary inductor $L_p$ in the Y direction or by changing the amount of cross-sectional overlap therewith in the X direction. This extra degree of coupling adjustment allows the overall impedance of the probe and the separate coupling constants to be adjusted while having minimal effects on any resonant frequency.

Figure 5:
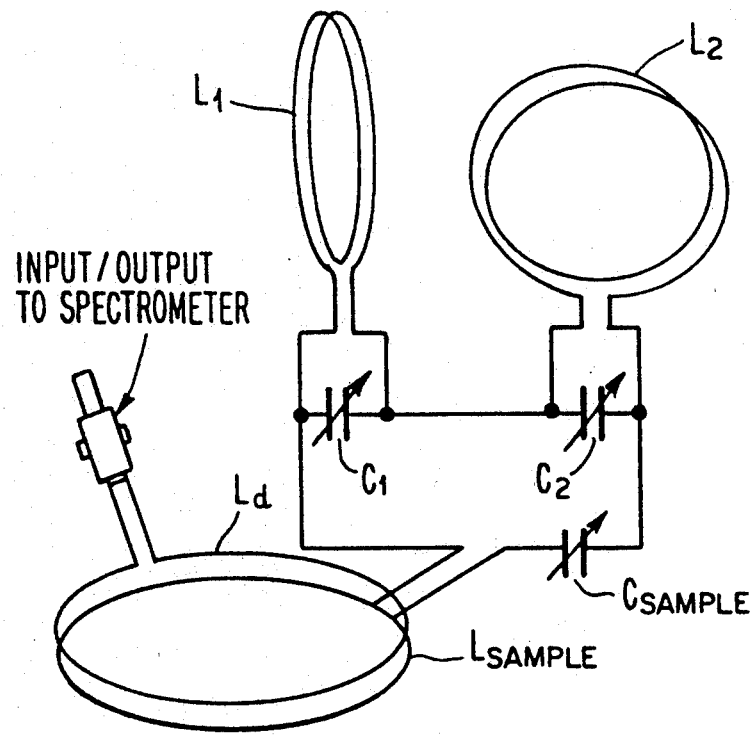
FIG. 5 illustrates a prior art double-tuned probe configuration in which the inductors are arranged so that they will not couple to each other.

The circuit of FIG. 6 is further characterized in that the capacitive coupled parallel LC circuit of the sample surface coil $L_s$ is changed to a series LC circuit and arranged with respect to the primary inductor $L_p$ as shown in FIG. 7. As just noted, such an arrangement allows the probe to be driven through the two inductors $L_1$ and $L_2$ rather than just through the sample inductor $L_s$ as in the probe of prior art FIG. 5. This allows the sensitivity of the probe to be maintained at each resonant frequency while also allowing adjustment of the probe without the overcoupling effects of prior art probes.

During operation, the state of the transmit/receive switch connected to the primary inductor $L_p$ is changed to indicate whether the probe of the invention is to transmit RF frequency pulses or receive nuclear induction RF signals. As known to those skilled in the art, the transmit/receive switch is the link between the RF resonator and the RF pulse transmitter or the preamplifier of the spectrometer. The transmit/receive switch makes possible the path from the transmitter to the coils during the RF pulse and at the same time protects the sensitive preamplifier from the high pulse power. In the receive mode, the weak MR signal must reach the preamplifier with as little attenuation as possible, and the noise of the final stage must be kept out of the coil circuit. By contrast, in the transmit mode, the voltages are high enough so that the power reaches the coils with practically no loss. A quarter-wavelength cable may be used as the transmission line so as to transform a short circuit to a high impedance at the input of the coil. On the other hand, in the receive mode, the impedance of the transmission line is high so that the detected signal reaches the preamplifier virtually unattenuated by the quarter-wavelength line. Other adjustable components may also be used to neutralize capacitance.

Once it is determined whether the coils are to transmit or receive, the primary inductor $L_p$ and/or the inductors $L_1$ and $L_2$ are physically moved in the X and Y directions until the desired coupling and/or mutual inductance for highest efficiency is achieved. As noted above, the present inventors have discovered that the probe configuration of FIG. 6 allows quick and easy tuning and impedance matching with a minimal effect on any resonant frequency.

Figure 1:
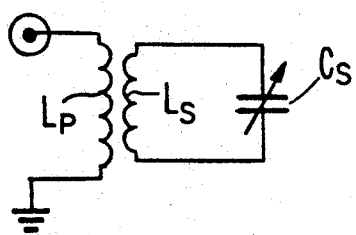
FIG. 1 is a schematic diagram of a prior art single-tuned probe.
Figure 2:
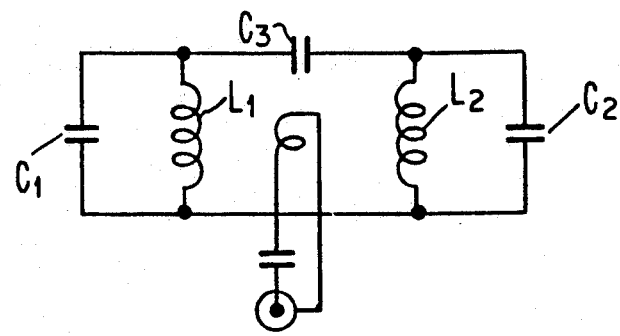
FIG. 2 is a schematic diagram of a prior art double-tuned loop gap resonator.
Figure 3:
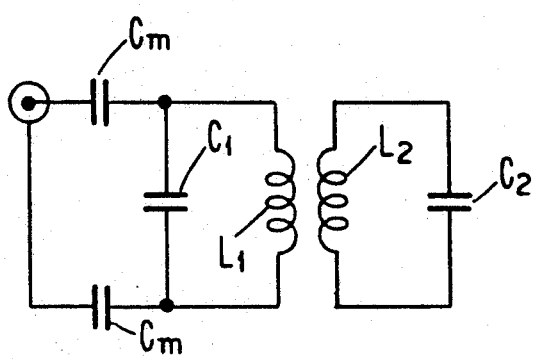
FIG. 3 is a schematic diagram of a prior art transformer-coupled double-tuned circuit.
Figure 4:
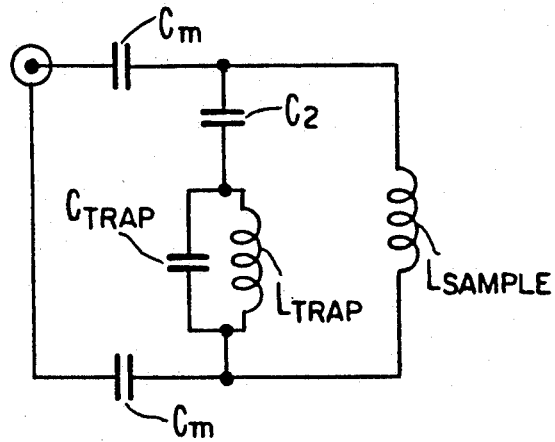
FIG. 4 is a schematic diagram of a prior art double-tuned trap circuit.

The triple-tuned probe of FIG. 6 was assembled and compared to a single-tuned surface coil probe which was made using similar inductors $L_s$ and $L_p$ and a single capacitor $C_s$ in accordance with the transformer coupled design shown in FIG. 1. The sample inductor $L_s$ was similar to that of the tripler tuned coil, and the capacitance $C_s$ was varied to tune in each of the desired three frequencies in turn. The probe impedance and transformer coupling were then adjusted by varying the relative positions of the two inductors.

To compare the sensitivity of the single and triple-tuned probes, phantoms containing $H_2O$, $D_2O$ and a pyrophosphate solution were each placed on the center of the sample inductor. The performance of the two probes was then tested by measuring the optimized pulse widths and signal to noise ratios of spectra of the phantoms. The in vivo $^{31}P$ and $^2H$ accumulation NMR pulses were single hard pulses of the optimized pulse width, following by immediate acquisition of the free induction decay. The pulse width for the maximum signal and the amplitude of the signal were measured at each of the nuclear frequencies. The transmit/receive switch and preamplifier tuned to each of the three nuclear frequencies using a multiply-tuned quarter wave line was placed between the probe and the spectrometer. NMR conditions and pulse sequences for obtaining in vivo $^1$H deoxymyoglobin spectra have been described, for example, by Wang et al. in an article entitled "In Vivo MRS Measurement of Deoxymyoglobin in Human Forearms", *Magnetic Resonance in Medicine*, Vol. 14, pp. 562-567 (1990), and thus further details of the experimental configuration will not be described in detail here.

Table 1 contains the relative pulse widths needed for maximum signal amplitudes for the three nuclei studied with the triple-tuned probe of FIG. 6 and the single-tuned probe of the type just described. The table entries in Table 1 are the measured ratios of the triple-tuned to single-tuned coil at 1.8 Tesla. Since comparable levels of noise were generated in each of the probes, the relative sensitivities given in Table 1 are also equivalent to the relative signal to noise ratios. Because the probe of FIG. 6 is a surface coil probe and the samples used for these measurements were small but finite phantoms, the measured pulse width for signal maxima are somewhat larger than true 90° pulse widths.

TABLE 1

| Nucleus | Frequency (MHz) | Relative Pulse Width | Relative Sensitivity |
| --- | --- | --- | --- |
| $^1$H | 72.8 | 1.0 | 1.4 |
| $^2$H | 12.0 | 2.0 | 0.7 |
| $^{31}$P | 23.4 | 2.0 | 0.6 |

Figure 8:
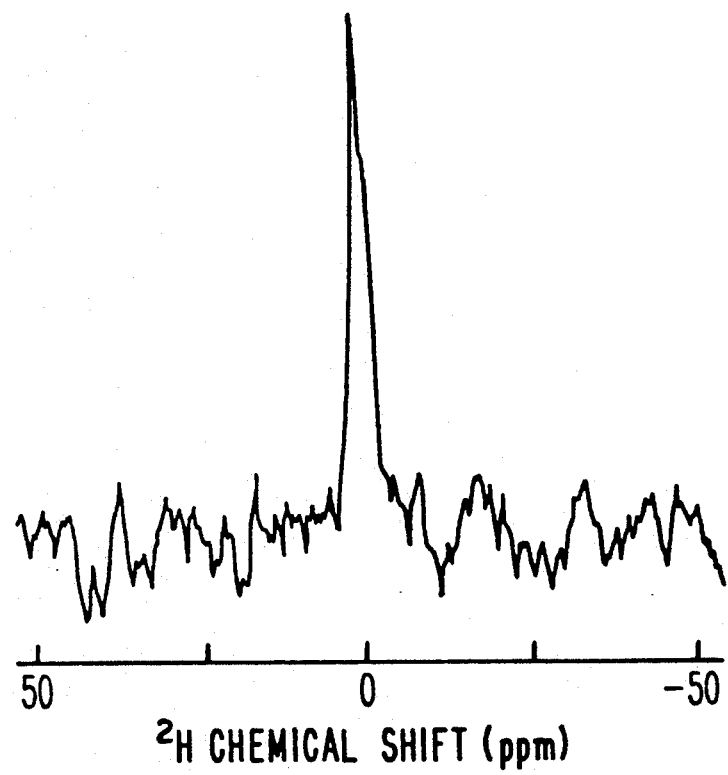
FIG. 8 illustrates the NMR spectrum of the natural abundance deuterium signal in the resting human calf muscle as taken with the triple-tuned probe of FIG. 6.

FIGS. 8 and 9 show typical NMR spectra of a human calf muscle, taken with the triple-tuned surface coil of FIG. 6 using the procedure described by Wang et al. In FIG. 7, the $^2$H natural abundance signal and the resting human calf as measured by the probe of the invention is displayed. This spectrum accumulated in 2.5 minutes and was composed of 300 free induction decays with a repetition time of 0.5 seconds. Exponential line broadening was 20 Hz and the applied pulse width was 200 μs.

FIGS. 9(A) and 9(B) show the $^1$H deoxymyoglobin signal and $^{31}$P spectra from the exercising human calf muscle which were obtained concurrently both at rest and during strenuous isometric flexion exercise. The $^1$H signal was accumulated every 50 ms and the $^{31}$P data were accumulated once every 3 seconds, while each spectral accumulation was 1 minute. These spectra show that the coil of the invention is sensitive enough for data collection in biomedical MR spectroscopy.

The triple-tuned probe described herein with respect to FIG. 6 can be considered an adaptation of the general concept of multiple-residence probes which have been previously described by Schnall et al. As in the probes described by Decorps et al. in an article entitled "An Inductively Coupled, Series-Tuned NMR Probe", *Journal of Magnetic Resonance*, Vol. 65, pp. 100-109 (1985) and Schnall in *NMR Techniques In The Study of Cardiovascular Structure and Function*, M. Osbakken and J. Haselgrove, eds., (Futura 10 Publishing, Mt. Kisco, N.Y.), Chapter 2, pp. 35-57 (1988), transformer coupling has been used in the probe of the invention for a good match over a broad frequency range. Also, in the circuit of FIG. 6, two separate "traps" of the type disclosed by Schnall et al. are used to couple in the spectrometer signal for transmitting and receiving. However, unlike the overcoupled probe circuit often used to create more than one resonant frequency as described by Schnall et al. in an article entitled "The Application of Overcoupled Tank Circuits to NMR Probe Design", *Journal of Magnetic Resonance*, Vol. 67, pp. 129-134 (1986) and Eleff et al. in an article entitled "Concurrent Measurements of Cerebral Blood Flow, Sodium, Lactate, and High-Energy Phosphate Metabolism Using $^{19}$F, $^{23}$Na, $^1$H and $^{31}$P Nuclear Magnetic Resonance Spectroscopy", *Magnetic Resonance in Medicine*, Vol. 7, pp. 412-424 (1988), in which the isolated individual resonant circuits tuned to the same frequency are shifted to lower resonant frequencies by the overcoupling, the probe of the invention has series resonant circuits tuned to individual resonant frequencies. This allows for easier tuning. However, for this reason, those skilled in the art will appreciate that the probe of the invention achieves best results for widely separated resonant frequencies.

Those skilled in the art will further appreciate that the probe of the invention has certain advantages with respect to the double-tuned probe described by Fitzsimmons et al. in that the probe of Fitzsimmons et al. actually has two overlapped sample inductors in a more complicated layout. Moreover, in the probe of Fitzsimmons et al., the primary circuit is tuned to one of the resonant frequencies and the secondary to the other. Hence, in the probe of Fitzsimmons et al., the two coils are both sample coils and the two probes are on one circuit. Such is not the case with the probe of the invention.

The driving inductor of the probe of the invention is quite different than that of Fitzsimmons et al. in that it is coupled to more than one inductor so that as each inductor is moved separate coupling constants may be adjusted. In addition, the probe of the invention is remotely tunable and is not driven at the sample coil. Instead, the probe of the invention is driven through trap coils including tank circuit inductors. Concentric placement of the multiple traps and the driving conductor enables the trap circuits of the invention to be tuned to three separate frequencies and matched to the impedance of the transmission line (typically 50 ohms) at all resonant frequencies of the trap circuits. The probes of Fitzsimmons et al. and others in the prior art could not match all three frequencies simultaneously due to the effects of overcoupling and the like. By contrast, the present invention uses the placement of the coils as an extra independent adjustment to allow tuning and impedance matching concurrently at all three frequencies while also enabling the probe to be sensitive enough for accurate MR measurement.

However, those skilled in the art will appreciate that there must be decreased sensitivity at one or more frequencies in multiply-tuned probes relative to a single-tuned coil. Table 1 shows that the loss level of the probe of FIG. 6 is acceptable since the signal to noise ratio at all frequencies remains good. One can show that the output from the probe $V_O$, ignoring all resistive losses, at resonant frequency $\omega_i$ for a given signal voltage $V_s$ in $L_s$ is:

$$\frac{V_0}{V_s} = k_i, i = 1, 2 \qquad \text{Equation 1}$$

where, $\omega_i^{-1} = L_i C_i$, and $k_i$ is the coefficient of coupling between coil i and the primary coil $L_p$, a geometric factor on the order of unity. $k_i$ is defined by $M_{ip} = k_i(L_i L_p)^{\frac{1}{2}}$, where $M_{ip}$ is the mutual inductance between $L_i$ and $L_p$. This analysis ignores any mutual inductance between $L_1$ and $L_2$, which is acceptable because each of these inductors is tuned to a distinct resonant frequency, where the primary inductor $L_p$ is untuned. The lowest resonant frequency, assuming that $\omega_s << \omega_1, \omega_2$, is given by $\omega_s^{-2} = C_s(L_1 + L_2 + L_s)$. The expression for the output voltage at $\omega_s$ is more complicated and depends explicitly on the ratios of three resonant frequencies. However, with the assumption that $\omega_s << \omega_1, \omega_2$, then:

$$\frac{V_0}{V_s} = \frac{k_1 L_1 + k_2 L_2}{L_s}. \qquad \text{Equation 2}$$

With appropriate values of $k_1$, $k_2$ and the inductors $L_1$, $L_2$, and $L_s$, it is possible to maintain the output signal relatively constant at each resonant frequency. Other factors, such as the volume of the sample, the desired sampling volume of the sample coil, and the resistive losses in the circuit will determine the exact sizes of each coil as would be apparent to those skilled in the art. Table 1 shows that the sensitivity of the probe of the invention is close enough to that of a single-tuned probe to make it a practical choice for NMR spectroscopy.

Although an exemplary embodiment of the invention has been described in detail above, those skilled in the art will readily appreciate that many additional modifications are possible in the exemplary embodiments without materially departing from the novel teachings and advantages of the invention. For example, the respective inductors shown in FIG. 6 need not be collinear and need not be symmetric. Instead, they need only be coupled two at a time through the inductors, unlike prior art probes where the coupling was done through the capacitors. Also, those skilled in the art will appreciate that the invention is not limited to a triple-tuned probe and that the teachings of the invention apply equally to probes which can detect a plurality of resonant frequencies. For example, such probes may be designed by adding extra trap circuits to the embodiment of FIG. 6. In addition, the sample coil need not be a surface coil; it may have a different shape from that shown so as to be useful for imaging or spectroscopy. Accordingly, all such modifications are intended to be included within the scope of this invention as defined in the following claims.

We claim:

1. A multi-frequency tuned probe, comprising:
   a first substantially planar inductor L1 disposed in a first plane;
   first means for tuning said first planar inductor L1 to a first resonant frequency;
   a second substantially planar inductor L2 disposed in a second plane, parallel to said first plane;
   second means for tuning said second planar inductor L2 to a second resonant frequency; and
   a substantially planar driving and receiving primary inductor Lp disposed in a third plane which is parallel to said first and second planes, said primary inductor Lp being adapted to transmit and receive RF pulses and signals and being disposed with respect to said first and second inductors L1 and L2 such that mutual inductance between L1 and Lp and between L2 and Lp occurs when a current is applied to L1, L2 and Lp, said mutual inductance being adjustable in accordance with the respective distances between each of said inductors L1, L2 and Lp in a direction perpendicular to said first, second and third planes and in accordance with the amount of overlap among said inductors L1, L2 and Lp in coordinate directions parallel to said first, second and third planes.

2. A multi-frequency tuned probe as in claim 1, further comprising a sample surface inductor Ls for transmitting and receiving RF pulses and signals and third means for tuning said sample surface inductor Ls to a third resonant frequency.

3. A multi-frequency tuned probe as in claim 2, wherein said first inductor L1 and second inductor L2 comprise coaxially disposed circular coils.

4. A multi-frequency tuned probe as in claim 3, wherein said primary inductor Lp comprises a primary circular coil disposed between said first inductor L1 and second inductor L2 such that at least a portion of a cross-section of said primary circular coil overlaps a cross-section of said coaxially disposed circular coils in said coordinate directions parallel to said first, second and third planes.

5. A multi-frequency tuned probe as in claim 4, wherein said mutual inductance between L1 and Lp and between L2 and Lp is changed in accordance with the amount of overlap between the cross-sections of said primary circular coil and said coaxially disposed circular coils and the distances between inductors L1 and Lp and between inductors L2 and Lp.

6. A multi-frequency tuned probe as in claim 4, wherein said primary circular coil is coaxial with said coaxially disposed circular coils.

7. A multi-frequency tuned probe as in claim 2, wherein said first tuning means comprises a first variable capacitance C1 electrically connected in parallel with said first inductor L1 so as to form a first tank circuit which is tuned to said first resonant frequency by adjusting a capacitance of said first variable capacitance C1 and said second tuning mean comprises a second variable capacitance C2 electrically connected in parallel with said second inductor L2 so as to form a second tank circuit which is tuned to said second resonant frequency by adjusting a capacitance of said second variable capacitance C2.

8. A multi-frequency tuned probe as in claim 7, further comprising a sample variable capacitance Cs electrically connected in series with said sample surface inductor Ls and said first and second tank circuits, said sample surface inductor Ls being tuned to said third resonant frequency by adjusting a capacitance of said sample variable capacitance Cs.

9. A multi-frequency tuned probe as in claim 8, further comprising a transmission line connected to said primary inductor Lp, wherein said first inductor L1, said second inductor L2 and said sample surface inductor Ls are respectively impedance matched to said transmission line at said first, second and third resonant frequencies simultaneously by adjusting capacitances of said first variable capacitance C1, said second variable capacitance C2, and said sample variable capacitance Cs.

10. A multi-frequency tuned probe, comprising:
    at least two trap circuits disposed concentrically about a common axis;
    means for tuning each trap circuit to a desired resonant frequency; and
    a driving and receiving primary inductor Lp substantially concentrically disposed with respect to said at least two trap circuits about said common axis such that mutual inductance between Lp and each of said trap circuits occurs when a current is applied to said trap circuits and Lp, said mutual inductance being adjustable in accordance with the respective distances between Lp and each of said trip circuits along said common axis.

* * * * *

UNITED STATES PATENT AND TRADEMARK OFFICE
CERTIFICATE OF CORRECTION

PATENT NO. : 5,243,289

DATED : September 7, 1993

INVENTOR(S) : Blum et al.

It is certified that error appears in the above-identified patent and that said Letters Patent is hereby corrected as shown below:

Column 9, line 56, delete "10".

Column 10, line 61, change "$^{-1}$" to --$^{-2}$--.

Signed and Sealed this

Twenty-eighth Day of June, 1994

Attest:

BRUCE LEHMAN

Attesting Officer      Commissioner of Patents and Trademarks